(12) United States Patent
Kaupmann et al.

(10) Patent No.: US 11,066,295 B2
(45) Date of Patent: Jul. 20, 2021

(54) MICROMECHANICAL COMPONENT HAVING AN OSCILLATOR, A METHOD FOR THE MANUFACTURE THEREOF, AND A METHOD FOR EXCITING A MOTION OF AN ADJUSTABLE ELEMENT ABOUT A ROTATIONAL AXIS

(71) Applicant: Robert Bosch GmbH, Stuttgart (DE)

(72) Inventors: Philip Kaupmann, Gundelfingen (DE); Stefan Pinter, Reutlingen (DE); Helmut Grutzeck, Kusterdingen (DE); Jochen Franz, Reutlingen (DE); Joerg Muchow, Munich (DE)

(73) Assignee: Robert Bosch GmbH, Stuttgart (DE)

( * ) Notice: Subject to any disclaimer, the term of this patent is extended or adjusted under 35 U.S.C. 154(b) by 198 days.

(21) Appl. No.: 16/476,609

(22) PCT Filed: Nov. 16, 2017

(86) PCT No.: PCT/EP2017/079455
§ 371 (c)(1),
(2) Date: Jul. 9, 2019

(87) PCT Pub. No.: WO2018/130326
PCT Pub. Date: Jul. 19, 2018

(65) Prior Publication Data
US 2019/0359478 A1  Nov. 28, 2019

(30) Foreign Application Priority Data

Jan. 11, 2017 (DE) .................... 10 2017 200 352.9

(51) Int. Cl.
*G02B 26/08* (2006.01)
*B81B 3/00* (2006.01)
*G02B 26/10* (2006.01)

(52) U.S. Cl.
CPC ............ *B81B 3/004* (2013.01); *G02B 26/085* (2013.01); *G02B 26/0841* (2013.01);
(Continued)

(58) Field of Classification Search
CPC .............. B81B 3/004; B81B 2201/042; B81B 2203/056; B81B 2203/058; B81B 3/0048;
(Continued)

(56) References Cited

U.S. PATENT DOCUMENTS

2005/0156481 A1   7/2005 Zhou et al.
2012/0320379 A1*  12/2012 Hofmann ............. G02B 26/101
                                                          356/445

FOREIGN PATENT DOCUMENTS

DE   102009026507 A1   12/2010
DE   102011006598 A1   10/2012
(Continued)

OTHER PUBLICATIONS

International Search Report dated Feb. 8, 2018 of the corresponding International Application PCT/EP2017/079455.
(Continued)

*Primary Examiner* — Euncha A Cherry
(74) *Attorney, Agent, or Firm* — Norton Rose Fulbright Us LLP; Gerard Messina

(57) ABSTRACT

A micromechanical component having a mount, an adjustable element, which is connected via at least one spring to the mount, and an actuator device, a first oscillatory motion of the adjustable element about a first axis of rotation and simultaneously a second oscillatory motion of the adjustable element, which is set into the first oscillatory motion, being excitable about a second axis of rotation in response to the actuator device; and the adjustable element being configured by the at least one spring to be adjustable on the mount in such a way that the adjustable element is adjustable by a
(Continued)

resulting angular momentum about a rotational axis, which is oriented orthogonally to the first axis of rotation and orthogonally to second axis of rotation. Also, a method for manufacturing a micromechanical component. Moreover, a method for exciting a motion of an adjustable element about a rotational axis.

13 Claims, 9 Drawing Sheets

(52) U.S. Cl.
CPC ......... *G02B 26/0858* (2013.01); *G02B 26/10* (2013.01); *B81B 2201/042* (2013.01); *B81B 2203/056* (2013.01); *B81B 2203/058* (2013.01)

(58) Field of Classification Search
CPC .............. G02B 26/0841; G02B 26/085; G02B 26/0858; G02B 26/10; G02B 26/101
USPC ...................................... 359/224.1
See application file for complete search history.

(56) References Cited

FOREIGN PATENT DOCUMENTS

| | | |
|---|---|---|
| DE | 102012219591 A1 | 4/2014 |
| DE | 102014211027 A1 | 12/2015 |
| JP | 2010008611 A | 1/2010 |
| JP | 2013178418 A | 9/2013 |
| JP | 2015227899 A | 12/2015 |
| JP | 2016219603 A | 12/2016 |
| WO | 2015152309 A1 | 10/2015 |

OTHER PUBLICATIONS

Kaupmann, et al.: "Design of a 2D MEMS Micromirror with Indirect Static Actuation", IEEE (2017), pp. 1-3.
Kaupmann, et al.: "A Novel Gyroscopic Actuation Concept for 2D MEMS Micromirrors", in proceedings: Eurosensors, Paris (2017), pp. 1-5.
Scholles, et al.: "Ultra compact laser projection systems based on two-dimentional resonant micro scanning mirrors", in proceedings of SPIE, (2007) Micro and Nanofabrication, San Jose, CA, USA. pp. 1-12.

* cited by examiner

MICROMECHANICAL COMPONENT HAVING AN OSCILLATOR, A METHOD FOR THE MANUFACTURE THEREOF, AND A METHOD FOR EXCITING A MOTION OF AN ADJUSTABLE ELEMENT ABOUT A ROTATIONAL AXIS

FIELD

The present invention relates to a micromechanical component. The present invention also relates to a method for manufacturing a micromechanical component. Moreover, the present invention relates to a method for exciting a motion of an adjustable element about a rotational axis.

BACKGROUND INFORMATION

German Patent Application No. DE 10 2012 219 591 A1 describes a micromechanical component, which has at least one spring having an adjustable element that is connected to a mount. Moreover, the micromechanical component includes at least one flexural actuator, which engages with the at least one spring and is modifiable in form in response to at least one electrical signal in such a way that the adjustable element can be set into a motion about an axis of rotation in response to a restoring force resulting from the deformation of the at least one flexural actuator. Moreover, the adjustable element is also supposed to be adjustable about a further axis of rotation in response to at least one further actuator.

SUMMARY

The present invention provides a micromechanical component, a method for manufacturing a micromechanical component, and a method for exciting a motion of an adjustable element about an axis of rotation.

The present invention makes possible a motion/an oscillatory motion of the adjustable element about the rotational axis utilizing gyroscopic effects. An excitation of this kind is generally more energy efficient than conventional drives, such as a conventional electromagnetic drive. Moreover, instead of using an electromagnetic drive, a utilization of the present invention eliminates the conventional need for connecting at least one permanent magnet to the adjustable element. Thus, the present invention also makes it easier to minimize micromechanical components and thereby aids in enhancing potential applications for using the same.

In an advantageous specific embodiment of the micromechanical component, the actuator device is designed to enable the adjustable element to be set into a first resonant oscillatory motion, as the first oscillatory motion, and simultaneously into a second resonant oscillatory motion, as the second oscillatory motion, in such a way that the adjustable element is able to be set by the resulting angular momentum into a static oscillatory motion about the rotational axis. Thus, the present invention makes possible a static/quasi-static deflection of the adjustable element about the rotational axis in response to purely resonant excitations (utilizing gyroscopic effects). Thus, the energy efficiency of the first resonant oscillatory motion and of the second resonant oscillatory motion may be utilized for statically/quasi-statically deflecting the adjustable element about the rotational axis.

The adjustable element preferably includes a mirror plate having a reflective surface, the adjustable element being able to be set into the first oscillatory motion about the first axis of rotation, which is oriented orthogonally to the reflective surface, and simultaneously into the second oscillatory motion or into the first oscillatory motion and simultaneously into the second oscillatory motion about the second axis of rotation, which is oriented orthogonally to the reflective surface. If the first axis of rotation is oriented orthogonally to the reflective surface, the second oscillatory motion and the adjusting motion of the adjustable element about the rotational axis may be used for scanning a surface. (In this case, the first oscillatory motion has no/hardly any influence on a light beam reflected off of the reflective surface.) Accordingly, if the second axis of rotation is oriented orthogonally to the reflective surface, the first oscillatory motion and the adjusting motion of the adjustable element about the rotational axis may be used for scanning a surface. (In this case, the second oscillatory motion has no/hardly any influence on the reflected light beam.) The specific embodiment of the micromechanical component described here is thus advantageously suited for a scanning device or a projector. In particular, the specific embodiment described here is suited for virtual reality glasses or data viewing glasses.

For example, as the at least one spring, the micromechanical component may include at least one inner spring, at least one intermediate spring, and at least one outer spring; and the adjustable element may be connected via at least one inner spring to an inner intermediate frame; the inner intermediate frame may be connected at least via the at least one intermediate spring to an outer intermediate frame; and the outer intermediate frame may be connected via the at least one outer spring to the mount. It is, thus, possible to reliably realize a suspension of the adjustable element in a way that makes it (resonantly) adjustable about the first axis of rotation, (resonantly) about the second axis of rotation, and (statically/quasi-statically) about the rotational axis.

In one possible specific embodiment, the adjustable element, which is set into the first oscillatory motion, is adjustable about the first axis of rotation relative to the inner intermediate frame, the outer intermediate frame, and the mount in response to the actuator device; and the outer intermediate frame and the inner intermediate frame, together with the adjustable element, which is set into the second oscillatory motion, are adjustable relative to the mount about the second axis of rotation in response to the actuator device, the inner intermediate frame, together with the adjustable element, being adjustable about the rotational axis relative to the outer intermediate frame and the mount in response to the resulting angular momentum. In the same way, the inner intermediate frame, together with the adjustable element, which is set into the first oscillatory motion, are adjustable relative to the outer intermediate frame and the mount about the first axis of rotation in response to the actuator device; and the outer intermediate frame and the inner intermediate frame, together with the adjustable element, which is set into the second oscillatory motion, are adjustable relative to the mount about the second axis of rotation in response to the actuator device; the adjustable element being adjustable about the rotational axis relative to the inner intermediate frame, the outer intermediate frame, and the mount in response to the resulting angular momentum. In both cases, an effective adjustability of the adjustable element about the rotational axis is ensured.

In another advantageous specific embodiment of the micromechanical component, at least one piezoelectric flexural actuator of the actuator device is connected to the adjustable element and/or to the inner intermediate frame in such a way that, in response to a deformation of the at least one piezoelectric flexural actuator, the adjustable element is adjustable relative to the inner intermediate frame, the outer intermediate frame and the mount; or the inner intermediate frame, together with the adjustable element, are adjustable about the first axis of rotation relative to the outer intermediate frame and the mount. Thus, the advantages of the at least one flexural actuator may also be utilized for the present invention.

Alternatively or in addition thereto, at least one coil winding of the actuator device may be configured on and/or in the outer intermediate frame. In the same way, the actuator device may include stator electrodes secured to the mount and actuator electrodes secured to the outer intermediate frame. Thus, cost-effectively and readily realizable drive types may be utilized for the micromechanical component described here.

The advantages described above may also be realized for implementing a corresponding manufacturing method for a micromechanical component. The manufacturing method includes (at least) the steps of: Connecting an adjustable element at least via a spring having a mount, and devising an actuator device, which is designed for exciting a first oscillatory motion of the adjustable element relative to the mount about a first axis of rotation and for simultaneously exciting a second oscillatory motion of the adjustable element, which is set into the first oscillatory motion, relative to the mount about a second axis of rotation that is oriented obliquely to the first axis of rotation; the adjustable element being configured by the at least one spring to be adjustable on the mount in such a way that the adjustable element is displaced relative to the mount about a rotational axis that is oriented orthogonally to the first axis of rotation and orthogonally to the second axis of rotation in response to an angular momentum caused by the adjustable element, which is set into the first oscillatory motion, being set into the second oscillatory motion. It should be noted that the manufacturing method may be enhanced in accordance with the above described specific embodiments of the micromechanical component.

Moreover, the advantages discussed above are also provided by implementing a corresponding method for exciting a motion of an adjustable element about an axis of rotation. The method for exciting a motion of an adjustable element about an axis of rotation includes (at least) the steps of exciting a first oscillatory motion of the adjustable element, which is connected at least via at least one spring to a mount, about a first axis of rotation oriented orthogonally to the rotational axis, relative to the mount; and simultaneously exciting a second oscillatory motion of the adjustable element, which is set into the first oscillatory motion, about a second axis of rotation, which is oriented obliquely to the first axis of rotation and orthogonally to the rotational axis, relative to the mount in such a way that the adjustable element is displaced by an angular momentum caused by the adjustable element, which is set into the first oscillatory motion, being set into the second oscillatory motion about the rotational axis. The method for exciting a motion of an adjustable element about a rotational axis may also be further enhanced in accordance with the specific embodiments of the micromechanical component discussed above.

For example, a first resonant oscillatory motion of the adjustable element may be excited as the first oscillatory motion and simultaneously a second resonant oscillatory motion of the adjustable element, as the second oscillatory motion, in such a way that the adjustable element is set in response to the resulting angular momentum into a static oscillatory motion about the rotational axis.

Preferably, the first oscillatory motion of the adjustable element and simultaneously the in-phase or opposite-phase second oscillatory motion of the adjustable element are excited in such a way that the adjustable element is set by the resulting angular momentum into an oscillatory motion about the rotational axis. In an alternative specific embodiment, it is equally possible that a varying phase relation produces an oscillatory motion having different natural frequencies of the two resonant oscillatory motions.

BRIEF DESCRIPTION OF THE DRAWINGS

Other features and advantages of the present invention are explained in greater detail in the following with reference to the figures.

DETAILED DESCRIPTION OF EXAMPLE EMBODIMENTS

FIG. 1a through 1g show a schematic representation of a first specific embodiment of the micromechanical component and coordinate systems for clarifying the method of functioning thereof.

Figure 1A:
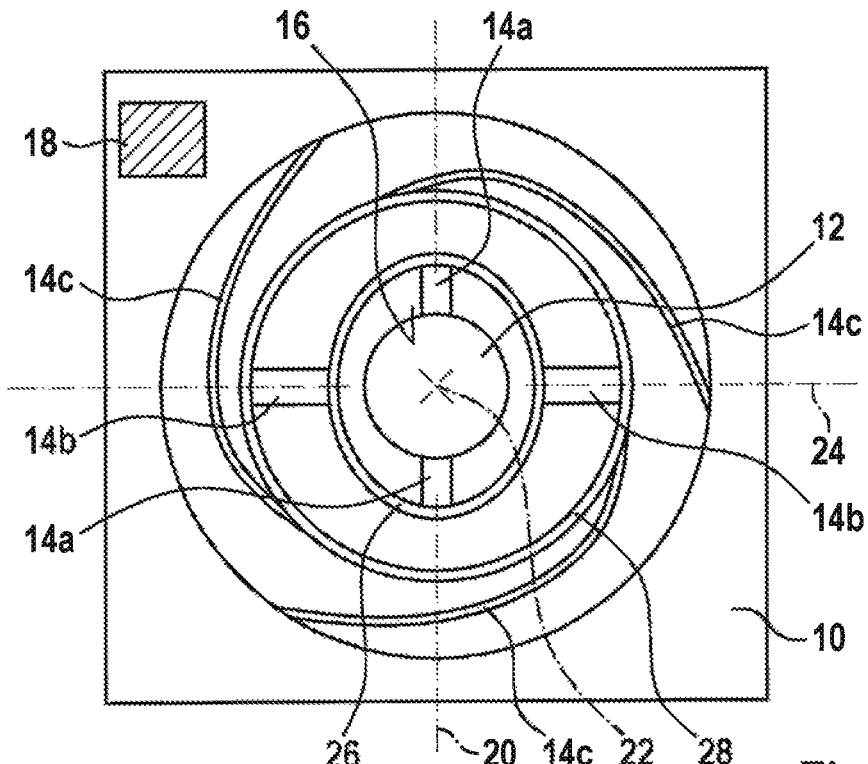
FIG. 1a through 1g show a schematic representation of a first specific embodiment of the micromechanical component and coordinate systems for explaining the method of functioning thereof.

The micromechanical component schematically illustrated in FIG. 1a includes a mount 10 and an adjustable element 12; adjustable element 12 being connected at least by a spring 14a through 14c to mount 10. Adjustable element 12 is exemplarily a mirror plate 12 having a reflective surface 16. It should be noted, however, that adjustable element 12 is not limited in the designability thereof to the example rendered in FIG. 1a.

The micromechanical component also has a (schematically illustrated) actuator device 18 which is designed to excite a first oscillatory motion of adjustable element 12 about a first axis of rotation 20 in relation to mount 10. Simultaneously (with the first oscillatory motion of adjustable element 12 about first axis of rotation 20), a second oscillatory motion of adjustable element 12, which is set into the first oscillatory motion, is excitable about a second axis of rotation 22 relative to mount 10 in response to actuator device 18. (Actuator device 18 is only reproduced schematically in FIG. 1a. Possible components of actuator device 18 will be discussed in detail below.) Second axis of rotation 22 is oriented obliquely to first axis of rotation 20. In particular, second axis of rotation 22 may be oriented orthogonally to first axis of rotation 20. (In the example of FIG. 1a, second axis of rotation 22 is oriented orthogonally to the image plane.)

By simultaneously exciting the first oscillatory motion of adjustable element 12 about first axis of rotation 20 and second oscillatory motion of adjustable element 12 about second axis of rotation 22, a moment of momentum of adjustable element 12 directed about first axis of rotation 20 is disturbed by a further moment of momentum of adjustable element 12 directed about second axis of rotation 22. Thus, an angular momentum is caused by adjustable element 12, which is set into first oscillatory motion (about first axis of rotation 20), being set into the second oscillatory motion (about second axis of rotation 22). The resulting angular momentum is directed orthogonally to first axis of rotation 20 and orthogonally to second axis of rotation 22. An amount of the resulting angular momentum is proportional to the product of a first angular velocity of the first oscillatory motion of adjustable element 12 about first axis of rotation 20 and of a second angular velocity of second oscillatory motion of adjustable element 12 about second axis of rotation 22. Moreover, adjustable element 12 is configured by the at least one spring 14a through 14c to be adjustable on mount 10 in such a way that the adjustable element is adjustable about rotational axis 24 relative to mount 10 about rotation axis 24, which is oriented orthogonally to first axis of rotation 20 and orthogonally to second axis of rotation 22, in response to the resulting angular momentum.

Thus, the micromechanical component described here makes it possible for adjustable element 12 to be adjusted about rotational axis 24 in response to an excitation of the first oscillatory motion about axis of rotation 20 and of second oscillatory motion about second axis of rotation 22. Therefore, the advantageous adjustability of adjustable element 12 makes it possible for the micromechanical component to be used in a variety of ways.

A frequency of an oscillatory motion of adjustable element 12 about rotational axis 24 is a function of a first drive frequency of the first oscillatory motion (about first axis of rotation 20) and of a second drive frequency of the second oscillatory motion (about second axis of rotation 22). The first drive frequency and the second drive frequency may be selected to match the desired, resulting frequency of the oscillatory motion of adjustable element 12 about rotational axis 24. If the first drive frequency and the second drive frequency coincide, any desired frequency of the oscillator motion of adjustable element 12 about rotational axis 24 may be generated by modulating a first amplitude of the first oscillatory motions and/or a second amplitude of the second oscillatory motions.

In particular, actuator device 18 may be designed in a way that enables adjustable element 12 to be set into a first resonant oscillatory motion (about first axis of rotation 20), as the first oscillatory motion and simultaneously into a second resonant oscillatory motion (about second axis of rotation 22), as the second oscillatory motion, in such a way that adjustable element 12 is able to be set/is set into a static (quasi-static) oscillatory motion about rotational axis 24 in response to the resulting angular momentum. Thus, the static (quasi-static) oscillatory motion of the adjustable element about rotational axis 24 may be achieved by a (purely) resonant excitation of the first oscillatory motion and of the second oscillatory motion of the adjustable element. Generally, resonant oscillatory motions may be driven at low power, while, for a (direct) excitation of a static/quasi-static motion, the related art always requires a directed force to deform at least a conventional spring element. To reduce a power to be applied to produce the usually required, directed force, it is known from the related art to only design the particular, at least one conventional spring element to be as "soft" as possible, which increases the fracture susceptibility thereof. Moreover, in conventional piezoresistive or electrostatic drive concepts, the problem also often arises that, in spite of inducing a substantial force, adequate deflection is not achieved since actuator travels of the drive concepts are too short.

However, the specific embodiment described here of the micromechanical component does not require the usually necessary directed force for (directly) exciting the static/quasi-static motion. Instead, the advantages of the resonant excitation of the first oscillatory motion about first axis of rotation 20 and of the second oscillatory motion about second axis of rotation 22 for the static (quasi-static) oscillatory motion of adjustable element 12 about rotational axis 24 may be utilized, which has a beneficial effect on an achieved deflection, a power consumption, a size of, and manufacturing costs of the micromechanical component.

The first resonant oscillatory motion of adjustable element 12 about first axis of rotation 20, and the second resonant oscillatory motion of adjustable element 12 about second axis of rotation 22 may have the same natural frequencies. However, the first resonant oscillatory motion of adjustable element 12 about first axis of rotation 20 may also have a first natural frequency that deviates from a second resonant natural frequency of the second oscillatory motion of adjustable element 12 about second axis of rotation 22.

In the example of FIG. 1a, second axis of rotation 22 is oriented orthogonally to reflective surface 16. Thus, actuator device 18, which is able to set adjustable element 12 into the first oscillatory motion (about first axis of rotation 20) and simultaneously into the second oscillatory motion about second axis of rotation 22, which is oriented orthogonally to reflective surface 16, may induce a deflection of a light beam directed at reflective surface 16 about first axis of rotation 20 (via the preferably resonant first oscillatory motion) and a simultaneous deflection of the light beam about rotational axis 24 (via the preferably static/quasi-static oscillatory motion). (The second oscillatory motion of adjustable element 12 about second axis of rotation 22 has no/hardly any influence on the light beam directed at reflective surface 16.) Thus, the micromechanical component described here may be used in a variety of ways, for example, in a scanning device or a projector. This advantage is also derived if first axis of rotation 20 is oriented orthogonally to reflective surface 16, and adjustable element 12 is able to be set by actuator device 18 into the first oscillatory motion (about first axis of rotation 20 oriented orthogonally to reflective surface 16) and simultaneously into the second oscillatory motion (about second axis of rotation 22).

As the at least one spring 14a through 14c, the micromechanical component of FIG. 1a exemplarily features at least one inner spring 14a, at least one intermediate spring 14b, and at least one outer spring 14c. Adjustable element 12 is connected via the at least one inner spring 14a to an inner intermediate frame 26. Inner intermediate frame 26 is connected at least via the at least one intermediate spring 14b to an outer intermediate frame 28. Outer intermediate frame 28 is at least connected via the at least one outer spring 14c to mount 10.

In the specific embodiment described here, adjustable element 12, which is set into the first oscillatory motion, is adjustable by actuator device 18 relative to inner intermediate frame 26, outer intermediate frame 28, and mount 10 (under a deformation of the at least one inner spring 14a) about first axis of rotation 20. That is why, in the specific embodiment of FIG. 1a, the at least one inner spring 14a is exemplarily a torsion spring and/or a flat spring which extend/extends along first axis of rotation 20. In particular, adjustable element 12 may be suspended between two inner springs 14a on inner intermediate frame 26. Moreover, outer intermediate frame 28 and inner intermediate frame 26, together with adjustable element 12, which is set into the second oscillatory motion, are adjustable by actuator device 18 relative to mount 10 about second axis of rotation 22 (under a deformation of the at least one outer spring 14c). Therefore, in the specific embodiment of FIG. 1a, a plurality of outer springs 14c, which wind around second axis of rotation 22, extend between mount 10 and outer intermediate frame 28. The resulting angular momentum effects that inner intermediate frame 26, together with adjustable element 12, is adjustable about rotational axis 24 relative to outer intermediate frame 28 and mount 10 (under a deformation of the at least one intermediate spring 14b). A torsion spring and/or flat spring, which extend(s) along rotational axis 14b, may be used for the at least one intermediate spring 14b along rotational axis 24. In addition, inner intermediate frame 26 may be suspended between two intermediate springs 14b on outer intermediate frame 28.

The amount of the angular momentum resulting from the first oscillatory motion and the second oscillatory motion is proportional to the product of the first angular velocity of the first oscillatory motion and the second angular velocity of the second oscillatory motion. For that reason, the amount of the resulting angular momentum is at the maximum thereof when the first oscillatory motion about first axis of rotation 20 and the second oscillatory motion about second axis of rotation 22 are excited in phase (i.e., with a phase difference of 0°) or in phase opposition (i.e., with a phase difference of 180°). Accordingly, the amount of the resulting angular momentum is at the minimum thereof when a phase difference of 90° or 270° is present between the first oscillatory motion about first axis of rotation 20 and the second oscillatory motion about second axis of rotation 22.

Figure 1B:
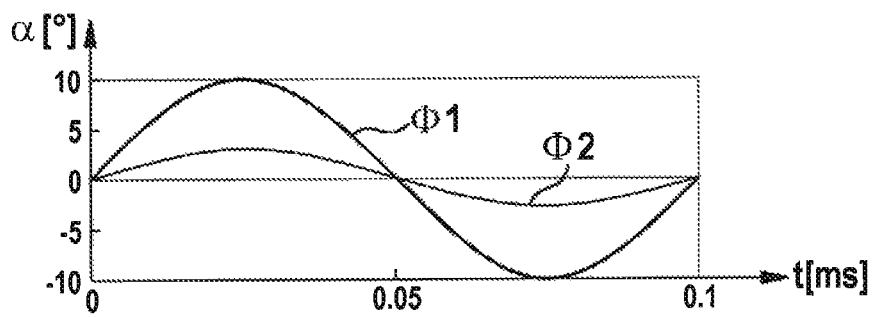
Figure 1C:
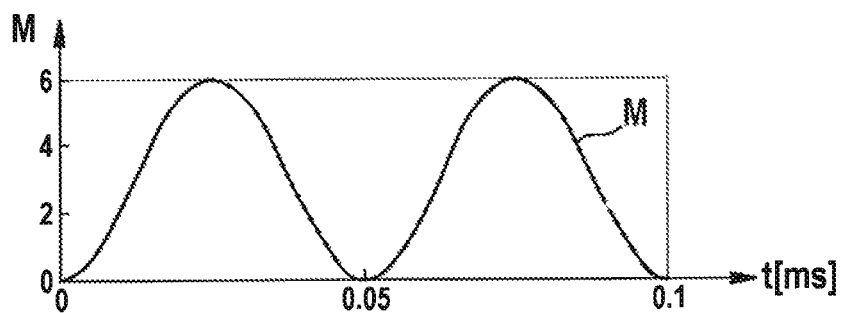
Figure 1D:
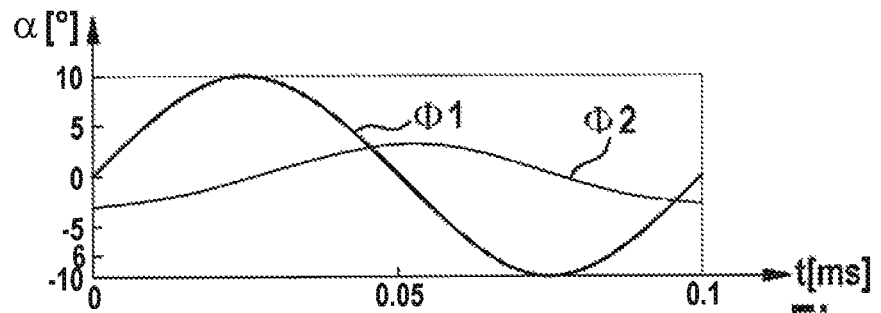
Figure 1E:
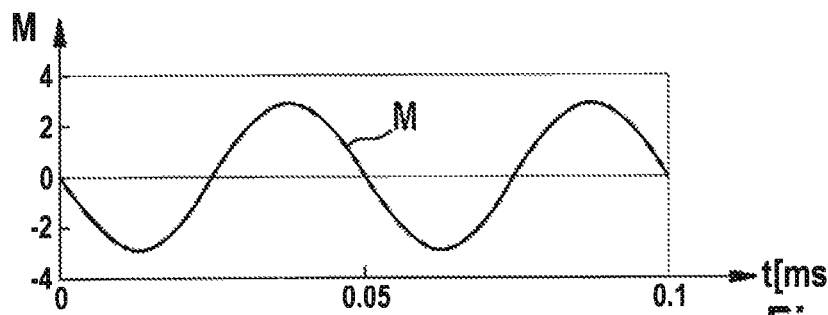

This is reproduced schematically by the coordinate systems of FIG. 1b through 1e, abscissas of FIG. 1b through 1e being a time axis t in each case (in milliseconds), and ordinates of FIGS. 1b and 1d reproducing a deflection α (in degrees) of first oscillatory motion Φ1 and of second oscillatory motion Φ2, and ordinates of FIGS. 1c and 1e reproducing resulting angular momentum M. Therefore, actuator device 18 is preferably designed to excite the first oscillatory motion of adjustable element 12 and, at the same time, the in-phase or opposite-phase second oscillatory motion of adjustable element 12 in such a way that adjustable element 12 is able to be set/is set by the resulting angular momentum into an oscillatory motion about rotational axis 24 (see FIGS. 1b and 1c). (As a comparison, FIGS. 1d and 1e show a phase difference of 90°).

If adjustable element 12 is deflected about rotational axis 24, then first axis of rotation 20 corotates, while second axis of rotation 22 remains unchanged. Thus, a position of first axis of rotation 20 relative to second axis of rotation 22 changes, whereby energy is transferred between the first oscillatory motion and the second oscillatory motion. Since the first oscillatory motion of adjustable element 12 about first axis of rotation 20 generally has a much larger first amplitude (than the second amplitude of the second oscillatory motion), a directed energy flow is especially generated from the first oscillatory motion to the second oscillatory motion, which leads to an increase in the second amplitude of the second oscillatory motion about second axis of rotation 22.

Figure 1F:
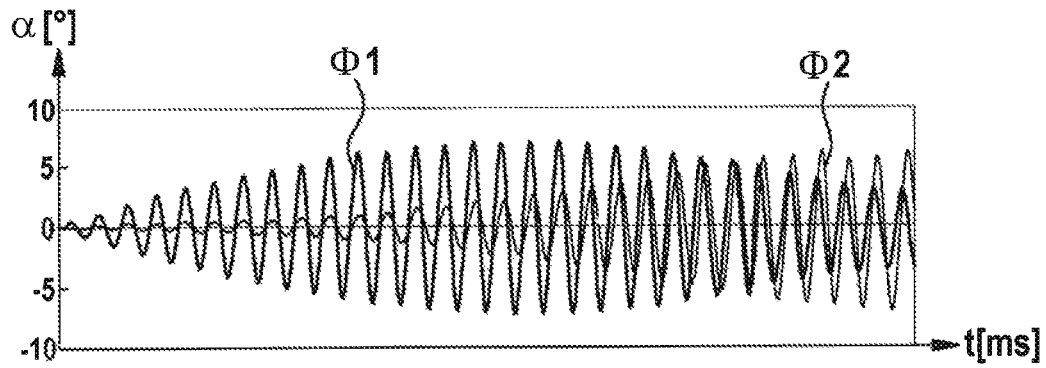
Figure 1G:
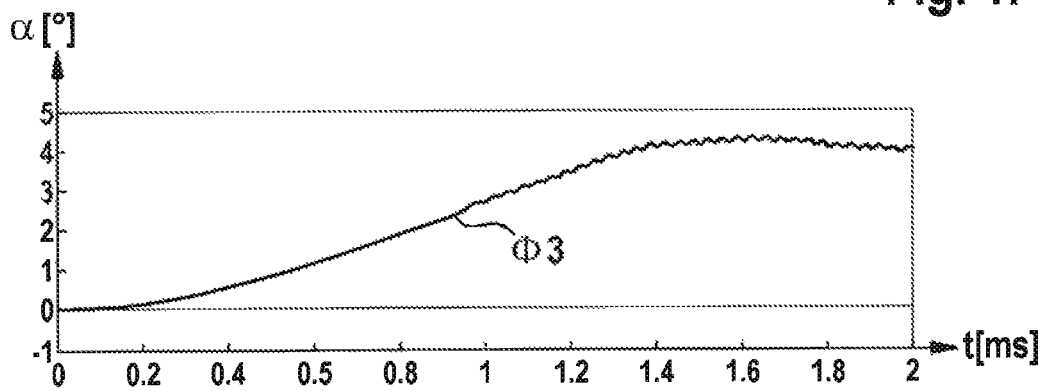

This is reproduced schematically by the coordinate systems of FIGS. 1f and 1g, abscissas of FIGS. 1f and 1g each being a time axis t (in milliseconds), and ordinates of FIGS. 1f and 1g a deflection α (in degrees) of first oscillatory motion Φ1, of second oscillatory motion Φ2 and of oscillatory motion Φ3 effected by resulting angular momentum about rotational axis 24.

It is thus possible to utilize a first drive/a first subunit of actuator device 18 for (directly) exciting/producing the first oscillatory motion about first axis of rotation 20, also to assist in producing the second oscillatory motion about second axis of rotation 22. Accordingly, a second drive/a second subunit of actuator device 18 for (directly) exciting/producing the second oscillatory motion about second axis of rotation 22 may be designed to be smaller and more cost effective.

Figure 2:
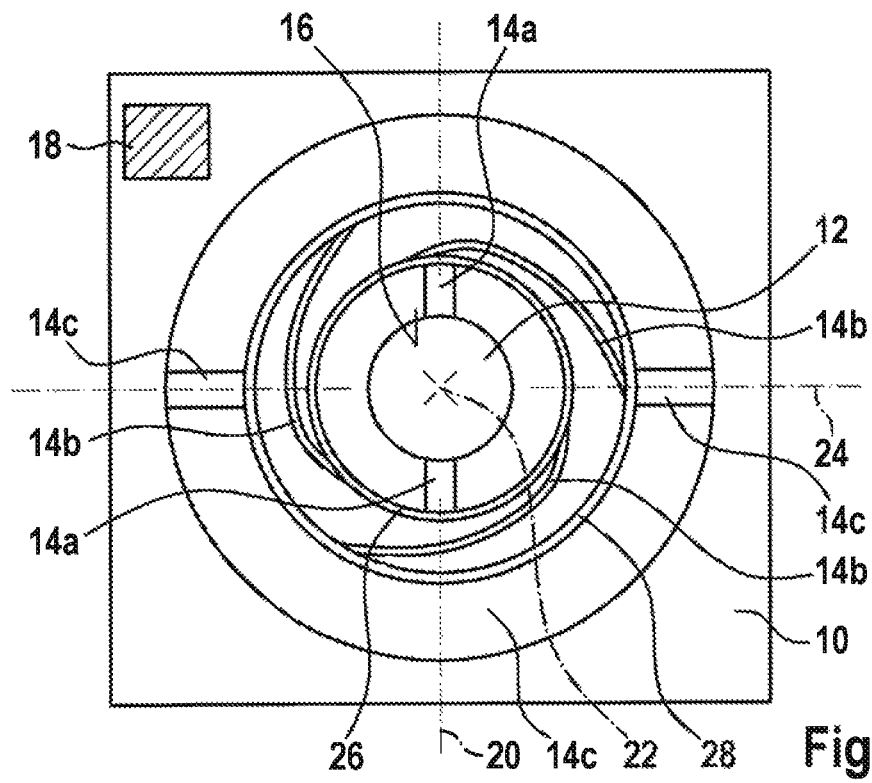
FIG. 2 is a schematic view of a second specific embodiment of the micromechanical component.

FIG. 2 is a schematic view of a second specific embodiment of the micromechanical component.

In the case of the micromechanical component of FIG. 2 as well, adjustable element 12, which is set into the first oscillatory motion, is adjustable relative to inner intermediate frame 26, outer intermediate frame 28, and mount 10 (under a deformation of the at least one inner spring 14a) about first axis of rotation 20 in response to actuator device 18. Thus, the same spring type may be used for the at least one inner spring 14a as in the case of the previously described specific embodiment. Moreover, inner intermediate frame 26, together with adjustable element 12, which is set into the second oscillatory motion, is adjustable relative to outer intermediate frame 28 and mount 10 (under a deformation of the at least one intermediate spring 14b) about second axis of rotation 22 in response to actuator device 18. Thus, the outer spring type of the previously described specific embodiment may be used for the at least one intermediate spring 14b. Outer intermediate frame 28 and inner intermediate frame 26, together with adjustable element 12, are adjustable (under a deformation of the at least one outer spring 14c) about rotational axis 24 in response to the resulting angular momentum. Thus, the intermediate spring type of the previously described specific embodiment may be used for the at least one outer spring 14c.

With regard to the further features of the micromechanical component of FIG. 2, reference is made to the previously described specific embodiment.

Figure 3:
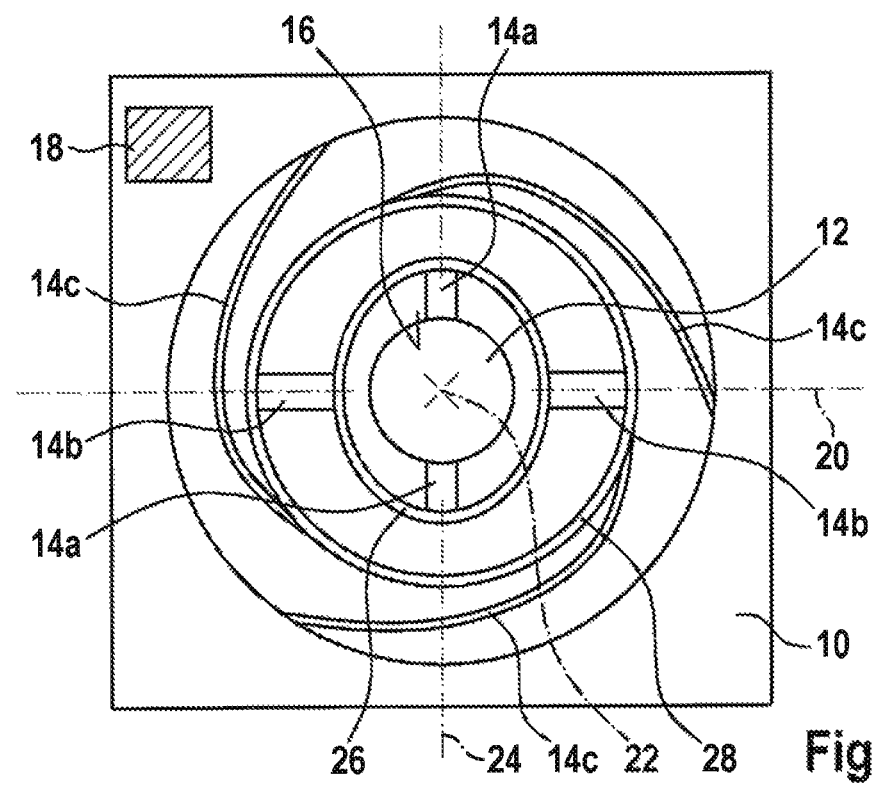
FIG. 3 is a schematic view of a third specific embodiment of the micromechanical component.

FIG. 3 is a schematic view of a third specific embodiment of the micromechanical component.

In this specific embodiment, inner intermediate frame 26, together with adjustable element 12, which is set into the first oscillatory motion, is adjustable relative to outer intermediate frame 28 and mount 10 (under a deformation of the at least one intermediate spring 14b) about first axis of rotation 20 in response to actuator device 18. Thus, the inner spring type of the specific embodiment of FIG. 1a may be used for the at least one intermediate spring 14b. Moreover, outer intermediate frame 28 and inner intermediate frame 26, together with adjustable element 12, which is set into the second oscillatory motion, are adjustable by actuator device 18 relative to mount 10 about second axis of rotation 22 (under a deformation of the at least one outer spring 14c). Thus, the same spring type, as in the specific embodiment of FIG. 1a, may be used for the at least one outer spring 14c. Adjustable element 12 is adjustable relative to inner intermediate frame 26, outer intermediate frame 28, and mount 10 (under a deformation of the at least one inner spring 14a) about rotational axis 24 in response to the resulting angular momentum. Thus, the intermediate spring type of the specific embodiment of FIG. 1a may be used for the at least one inner spring 14a.

With regard to the further features of the micromechanical component of FIG. 3, reference is made to the above description.

FIG. 4a through 4e are schematized overviews and partial views of a fourth specific embodiment of the micromechanical component.

Figure 4A:
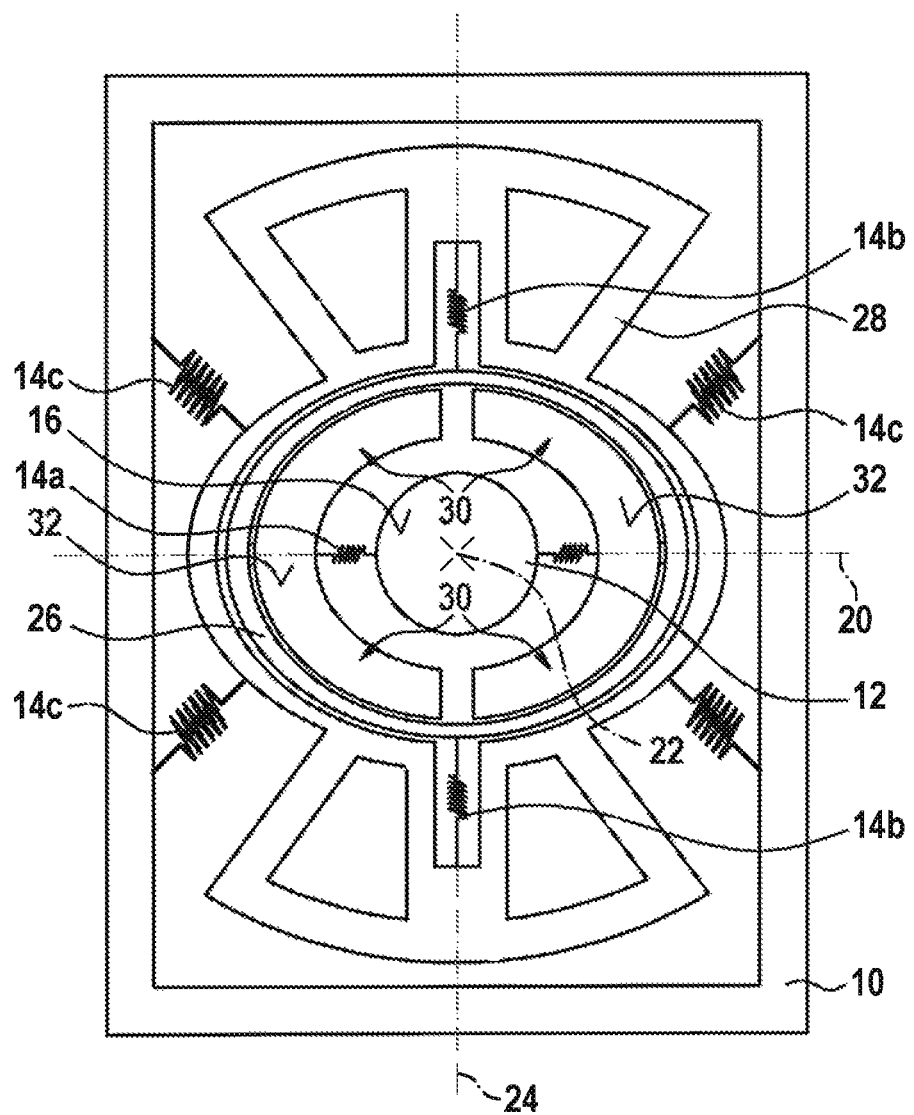
FIG. 4a through 4e are schematized overviews and partial views of a fourth specific embodiment of the micromechanical component.

To supplement the specific embodiment of FIG. 1a through 1g, the micromechanical component schematically illustrated in FIG. 4a has at least one piezoelectric flexural actuator 30 (as an element of actuator device 18). The at least one piezoelectric flexural actuator 30 is understood to be an actuator whose form is modifiable by an application/provision of at least one (time-varying) electrical signal in such a way that a restoring force resulting from the deformation of the at least one flexural actuator 30 acts on adjustable element 12. The at least one piezoelectric flexural actuator 30 is connected to adjustable element 12 (via the at least one inner spring 14a) and/or to inner intermediate frame 26 in such a way that, in response to a deformation of the at least one piezoelectric flexural actuator 30, adjustable element 12 is adjustable about first axis of rotation 20 relative to inner intermediate frame 26, outer intermediate frame 28 and mount 10 (or inner intermediate frame 26, together with adjustable element 12 relative to outer intermediate frame 28 and mount 10). For example, the at least one piezoelectric flexural actuator 30 may include at least one piezoelectric material, which is deposited on at least one substrate surface 32 (not shown) and/or electrodes (not illustrated) for applying the at least one (time-varying) electrical signal. In particular, this type of the at least one piezoelectric flexural actuator 30 is well suited for exciting the resonant first oscillatory motion of adjustable element 12 about first axis of rotation 20 since only a relatively "short excitation path" is needed to excite the resonant first oscillatory motion. With regard to the designability of the at least one piezoelectric flexural actuator 30, reference is also made to German Patent Application No. DE 10 2012 219 591 A1. Thus, a cost-effective and readily manufacturable actuator type may be used as the at least one piezoelectric flexural actuator 30.

A deformation of the at least one piezoelectric flexural actuator 30 is preferably in phase with the first oscillatory motion of adjustable element 12 about first axis of rotation 20. A high-mass formation of outer intermediate frame 28 makes it possible to reliably intercept interference effects of a plurality of piezoelectric flexural actuators 30.

The micromechanical component of FIG. 4a has two piezoelectric flexural actuators on a first side of first axis of rotation 20 and two further piezoelectric flexural actuators on a second side of first axis of rotation 20. One of the two piezoelectric flexural actuators on the same side of first axis of rotation 20 resides on a first side of rotational axis 24, while another one of the two piezoelectric flexural actuators on the same side of first axis of rotation 20 is configured on a second side of rotational axis 24. In the specific embodiment of FIG. 4a, inner intermediate frame 26 also frames the at least one piezoelectric flexural actuator 30. However, a configuration of this kind of the at least one piezoelectric flexural actuator 30 is only to be interpreted exemplarily.

Figure 4B:
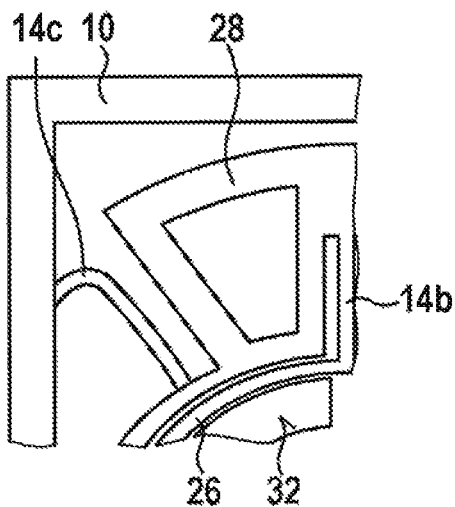
Figure 4C:
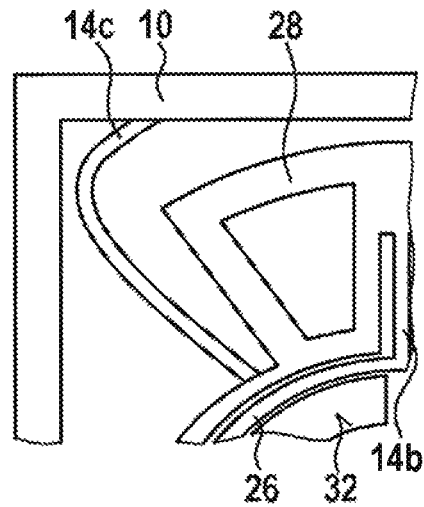
Figure 4D:
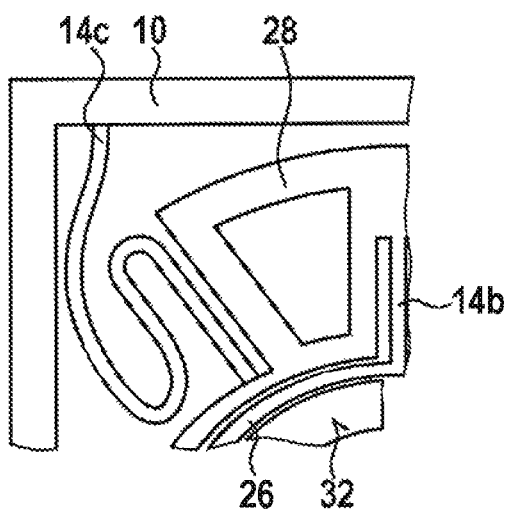
Figure 4E:
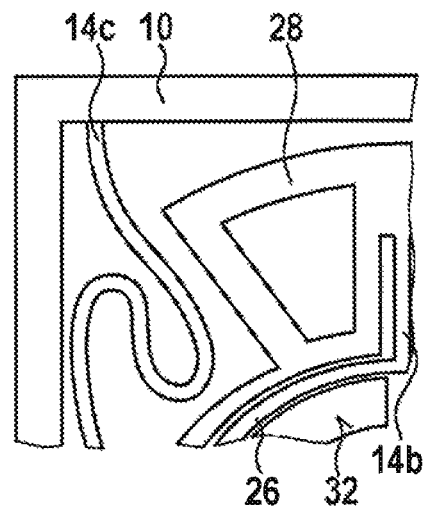

FIG. 4b through 4e graphically depict examples of forms of the at least one outer spring 14c. The at least one outer spring 14c may have an "L-shaped" form, for example, as illustrated in FIGS. 4b and 4c. The at least one outer spring 14c may also be meander-shaped, as shown in FIGS. 4d and 4e, so that an available space may be used to enhance a resilience of the least one outer spring 14c. Thus, spring types having a very rugged construction may be used for the at least one outer spring 14c. Moreover, it is possible to vary the mechanical stress or spring constant of the at least one outer spring 14c by an at least local widening and/or narrowing of the width thereof. This may also be utilized to influence the second resonant frequency of the second oscillatory motion.

With regard to the further features of the micromechanical component of FIG. 4, reference is made to the specific embodiment of FIG. 1a through 1g.

Figure 5:
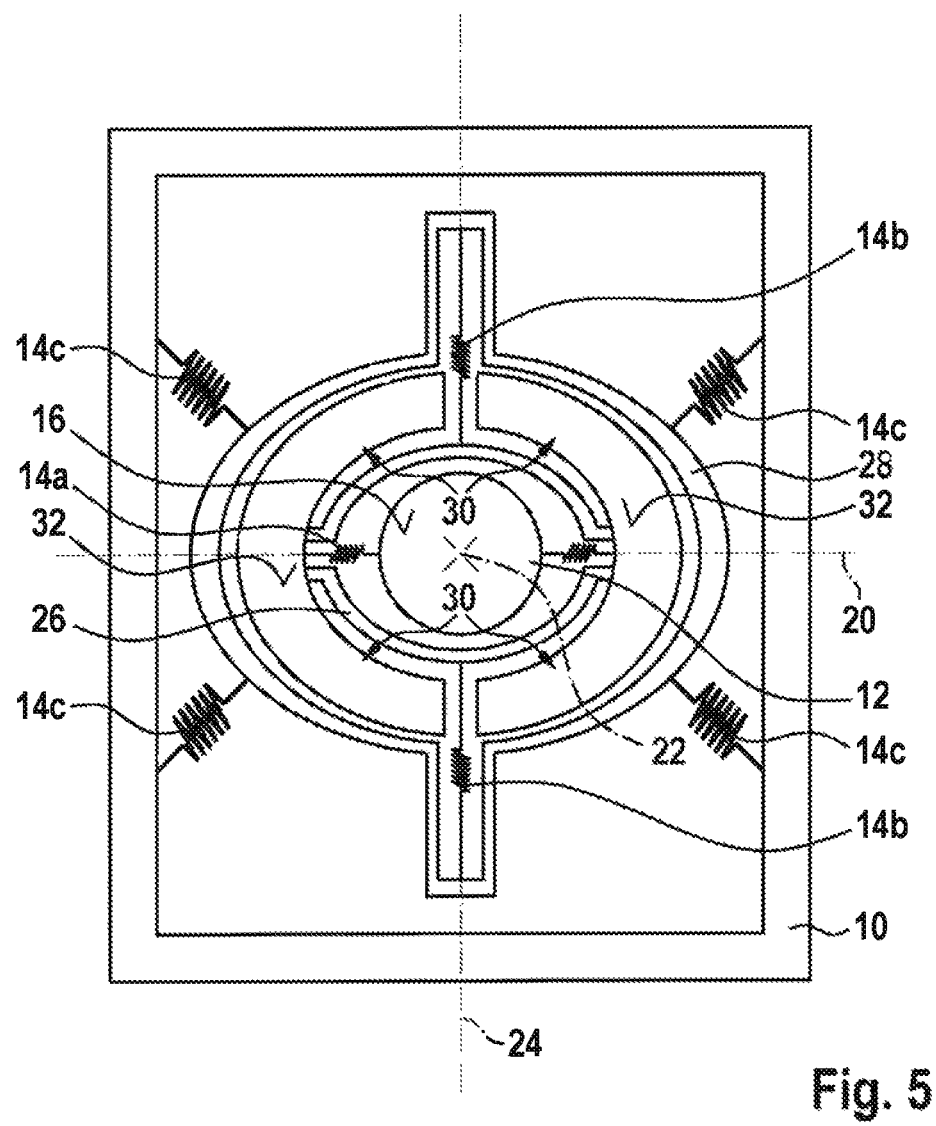
FIG. 5 is a schematic view of a fifth specific embodiment of the micromechanical component.

FIG. 5 is a schematic view of a fifth specific embodiment of the micromechanical component.

The micromechanical component of FIG. 5 features the at least one flexural actuator 30 outside of first intermediate frame 26. This permits a longer configuration of the at least one intermediate spring 14b, which is preferably used for the static (quasi-static) oscillatory motion of adjustable element 12 about rotational axis 24.

With regard to further features of the micromechanical component of FIG. 5, reference is made to the specific embodiment of FIG. 1a through 1g and 4.

Figure 6:
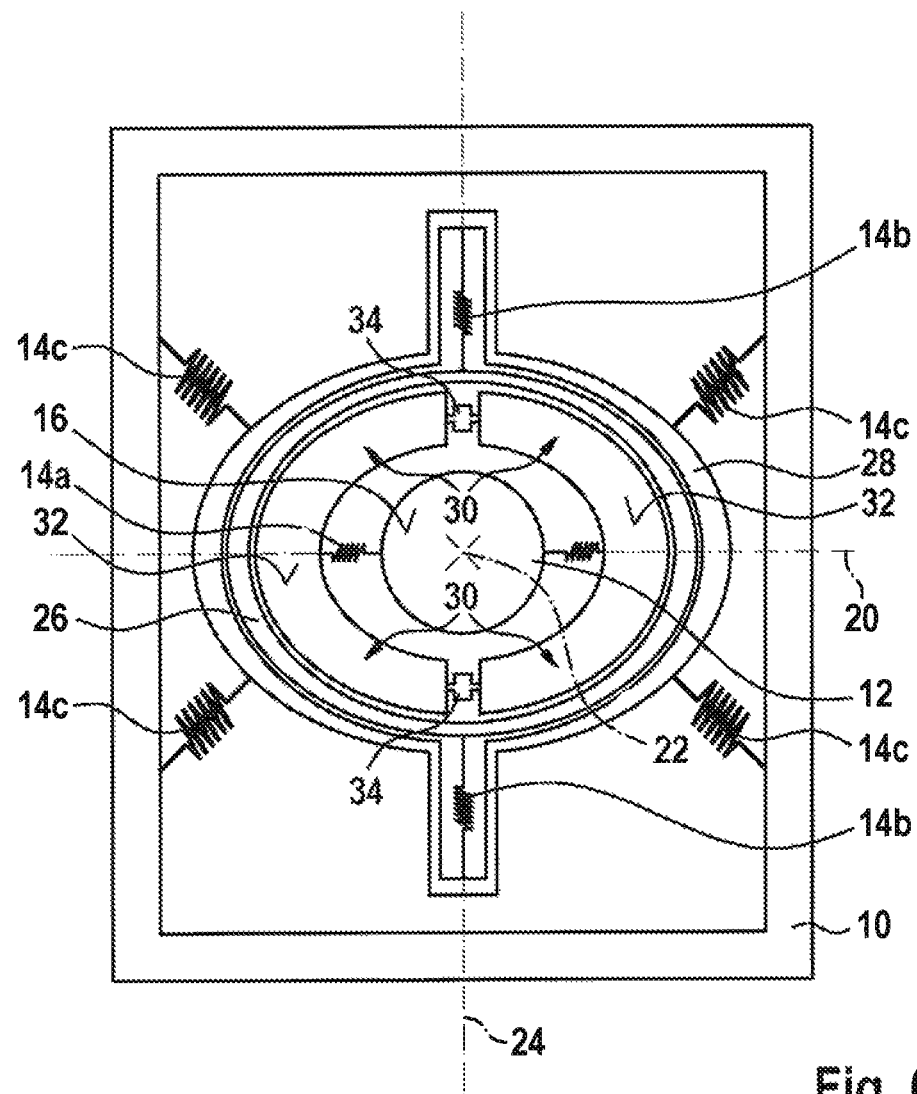
FIG. 6 is a schematic view of a sixth specific embodiment of the micromechanical component.

FIG. 6 is a schematic view of a sixth specific embodiment of the micromechanical component.

As a further refinement of the specific embodiment of FIG. 4, one more coupling spring 34 is formed in each case between the two piezoelectric flexural actuators 30 residing on the same side of first axis of rotation 20 in the case of the micromechanical component of FIG. 6. Coupling springs 34 enhance a robustness of the first oscillatory motion over parasitic modes.

With regard to the further features of the micromechanical component of FIG. 6, reference is made to the specific embodiment of FIG. 1a through 1g and 4.

Figure 7:
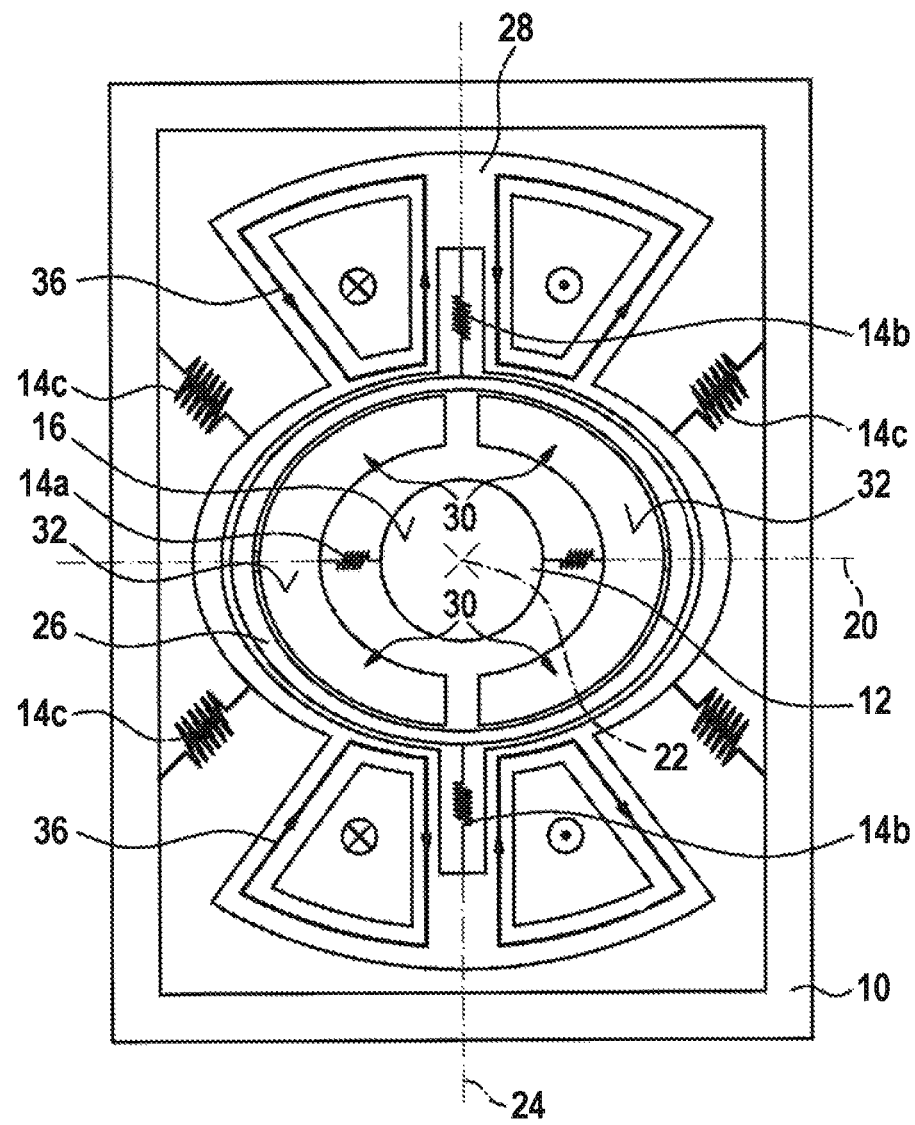
FIG. 7 is a schematic view of a seventh specific embodiment of the micromechanical component.

FIG. 7 is a schematic view of a seventh specific embodiment of the micromechanical component.

As a further refinement of the specific embodiment of FIG. 4a through 4e, the micromechanical component of FIG. 7 also has at least one coil winding 36 (as an element of actuator device 18), which is configured on and/or in external intermediate frame 28. Moreover, at least a permanent magnet may be installed on mount 10. If a current I is conducted through the at least one coil winding 36, then a Lorentz force F acts on the radial coil segments s of the at least one coil winding 36 in accordance with the equation (Equation 1) where:

$$\vec{F} = I(t)(\vec{s} \times \vec{B}),$$

B being an external magnetic field produced by the at least one permanent magnet. The electromagnetic drive of actuator device 18 may reliably produce the (preferably resonant) second oscillatory motion of adjustable element 12 about second axis of rotation 22.

With regard to further features of the micromechanical component of FIG. 7, reference is made to the specific embodiment of FIG. 1a through 1g and 4.

Figure 8:
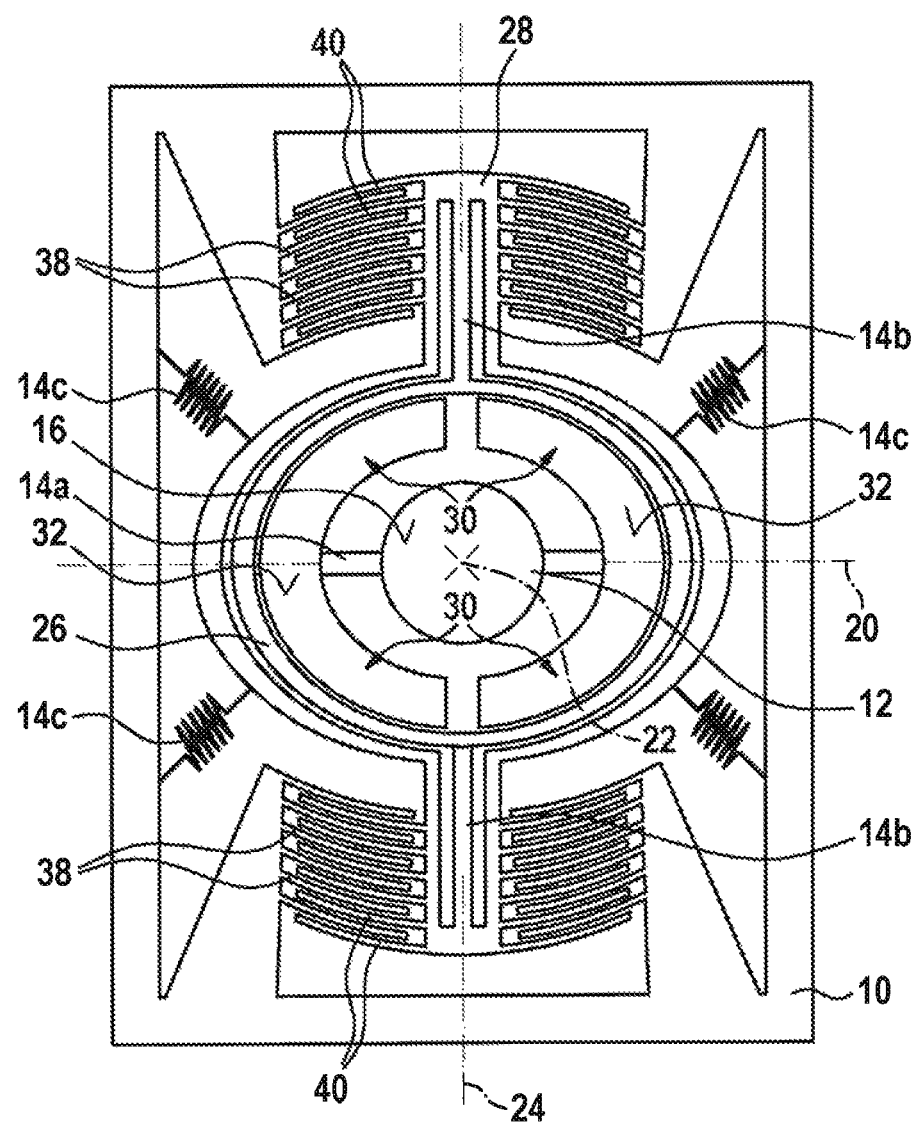
FIG. 8 is a schematic view of an eighth specific embodiment of the micromechanical component.

FIG. 8 is a schematic view of an eighth specific embodiment of the micromechanical component.

(As a further refinement of the specific embodiment of FIG. 4a through 4e), actuator device 18 of the micromechanical component of FIG. 8 also includes stator electrodes 38 secured to mount 10 and actuator electrodes 40 secured to outer intermediate frame 28. Electrodes 38 and 40 schematically illustrated in FIG. 8 may also reliably produce the (preferably resonant) second oscillatory motion of adjustable element 12 about second axis of rotation 22. It is thus possible to eliminate the need for equipping the micromechanical component with the electromagnetic drive (in particular, with the at least one permanent magnet thereof).

With regard to further features of the micromechanical component of FIG. 8, reference is made to the specific embodiment of FIG. 1*a* through 1*g* and 4.

What is claimed is:

1. A micromechanical component, comprising:
a mount;
an adjustable element connected via at least one spring to the mount; and
an actuator device configured to excite a first oscillatory motion of the adjustable element about a first axis of rotation relative to the mount, and to simultaneously excite a second oscillatory motion of the adjustable element, which is excited into the first oscillatory motion, about a second axis of rotation relative to the mount, the second axis of rotation being oriented obliquely to the first axis of rotation;
wherein the adjustable element is configured by the at least one spring to be adjustable on the mount in such a way that the adjustable element is able to be adjusted relative to the mount, in response to an angular momentum caused by the adjustable element, which is set into the first oscillatory motion, being set into the second oscillatory motion, about a rotational axis, which is oriented orthogonally to the first axis of rotation and orthogonally to the second axis of rotation.

2. The micromechanical component as recited in claim 1, wherein the actuator device is configured to set the adjustable element into a first resonant oscillatory motion, as the first oscillatory motion, and simultaneously into a second resonant oscillatory motion, as the second oscillatory motion, in such a way that the adjustable element is set in response to a resulting angular momentum into a static oscillatory motion about the rotational axis.

3. The micromechanical component as recited in claim 1, wherein the adjustable element includes a mirror plate having a reflective surface, and wherein the adjustable element is able to be set into the first oscillatory motion about the first axis of rotation oriented orthogonally to the reflective surface, and simultaneously into the second oscillatory motion or into the first oscillatory motion and simultaneously into the second oscillatory motion about the second axis of rotation, which is oriented orthogonally to the reflective surface.

4. The micromechanical component as recited in claim 1, wherein the at least one spring includes at least one inner spring, at least one intermediate spring, and at least one outer spring, and wherein the adjustable element is connected via the at least one inner spring to an inner intermediate frame, the inner intermediate frame is connected at least via the at least one intermediate spring to an outer intermediate frame, and the outer intermediate frame is at least connected via the at least one outer spring to the mount.

5. The micromechanical component as recited in claim 4, wherein the adjustable element, which is set into the first oscillatory motion, is adjustable relative to the inner intermediate frame, the outer intermediate frame, and the mount about the first axis of rotation in response to the actuator device, and the outer intermediate frame and the inner intermediate frame, together with the adjustable element, which is set into the second oscillatory motion, is adjustable relative to the mount about the second axis of rotation in response to the actuator device, and the inner intermediate frame, together with the adjustable element, are adjustable about the rotational axis relative to the outer intermediate frame and the mount in response to the resulting angular momentum.

6. The micromechanical component as recited in claim 4, wherein the inner intermediate frame, together with the adjustable element, which is set into the first oscillatory motion, is adjustable relative to the outer intermediate frame and the mount about the first axis of rotation in response to the actuator device, and the outer intermediate frame and the inner intermediate frame, together with the adjustable element, which is set into the second oscillatory motion, being adjustable relative to the mount about the second axis of rotation in response to the actuator device, and the adjustable element is adjustable about the rotational axis relative to the inner intermediate frame, the outer intermediate frame, and the mount in response to the resulting angular momentum.

7. The micromechanical component as recited in claim 5, where the actuator device includes at least one piezoelectric flexural actuator, the at least one piezoelectric flexural actuator of the actuator device being connected to the adjustable element and/or to the inner intermediate frame in such a way that, in response to a deformation of the at least one piezoelectric flexural actuator, the adjustable element is adjustable about the first axis of rotation relative to the inner intermediate frame, the outer intermediate frame and the mount, or the inner intermediate frame, together with the adjustable element is adjustable relative to the outer intermediate frame and the mount.

8. The micromechanical component as recited in claim 5, where the actuator device includes at least one coil winding, the at least one coil winding of the actuator device being configured on and/or in the outer intermediate frame.

9. The micromechanical component as recited in claim 5, wherein the actuator device includes stator electrodes secured to the mount and actuator electrodes secured to the outer intermediate frame.

10. A method for manufacturing a micromechanical component, comprising:
connecting an adjustable element at least via at least one spring to a mount; and
configuring an actuator device, the actuator device being configured to excite a first oscillatory motion of the adjustable element relative to the mount about a first axis of rotation and for simultaneously exciting a second oscillatory motion of the adjustable element, which is set into the first oscillatory motion, relative to the mount about a second axis of rotation, which is oriented obliquely to the first axis of rotation;
wherein the adjustable element is configured by the at least one spring to be adjustable on the mount in such a way that the adjustable element is displaced relative to the mount in response to an angular momentum caused by the adjustable element, which is set into the first oscillatory motion, being set into the second oscillatory motion, about a rotational axis, which is oriented orthogonally to the first axis of rotation and orthogonally to the second axis of rotation.

11. A method for exciting a motion of an adjustable element about a rotational axis, comprising:
exciting a first oscillatory motion of the adjustable element connected at least via at least one spring to a mount about a first axis of rotation oriented orthogonally to the rotational axis, relative to the mount; and
simultaneously exciting a second oscillatory motion of the adjustable element, which is set into the first oscillatory motion, about a second axis of rotation, which is oriented obliquely to the first axis of rotation and orthogonally to the rotational axis, relative to the mount, in such a way that the adjustable element is adjusted in response to an angular momentum caused by the adjustable element, which is set into the first oscillatory motion, being set into the second oscillatory motion about the rotational axis.

12. The method as recited in claim 11, wherein a first resonant oscillatory motion of the adjustable element is excited as the first oscillatory motion and simultaneously a second resonant oscillatory motion of the adjustable element, as the second oscillatory motion, in such a way that the adjustable element is set by the resulting angular momentum into a static oscillatory motion about the rotational axis.

13. The method as recited in claim 11, wherein the first oscillatory motion of the adjustable element and simultaneously an in-phase or opposite-phase second oscillatory motion of the adjustable element being excited in such a way that the adjustable element is set in response to the resulting angular momentum into an oscillatory motion about the rotational axis.

* * * * *